United States Patent
Strang (10) Patent No.: US 7,260,500 B2
(45) Date of Patent: Aug. 21, 2007

(54) METHOD AND APPARATUS FOR MONITORING AND VERIFYING EQUIPMENT STATUS

(75) Inventor: Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 93 days.

(21) Appl. No.: 10/495,117

(22) PCT Filed: Jan. 30, 2003

(86) PCT No.: PCT/US03/01071

§ 371 (c)(1),
(2), (4) Date: May 19, 2004

(87) PCT Pub. No.: WO03/065410

PCT Pub. Date: Aug. 7, 2003

(65) Prior Publication Data

US 2004/0267547 A1    Dec. 30, 2004

Related U.S. Application Data

(60) Provisional application No. 60/352,504, filed on Jan. 31, 2002.

(51) Int. Cl.
*G06F 11/277* (2006.01)

(52) U.S. Cl. .......................... 702/183; 372/26

(58) Field of Classification Search .......... 702/31, 702/64, 65, 124, 182–185, 190, 193; 324/652, 324/653, 655; 356/461, 463, 467–470, 490; 372/26; 427/575
See application file for complete search history.

(56) References Cited

U.S. PATENT DOCUMENTS

| 4,410,992 | A | 10/1983 | Javan ........................... 372/32 |
|---|---|---|---|
| 4,991,962 | A * | 2/1991 | Jain ............................. 356/490 |
| 5,037,666 | A * | 8/1991 | Mori ............................ 427/575 |
| 5,079,444 | A | 1/1992 | Kallenbach et al. ........ 359/328 |
| 5,136,261 | A | 8/1992 | Lewis ........................ 331/94.1 |
| 5,414,726 | A * | 5/1995 | Raj et al. ...................... 372/26 |
| 6,025,725 | A | 2/2000 | Gershenfeld et al. ....... 324/652 |
| 6,233,052 | B1 | 5/2001 | Zare et al. ................... 356/437 |
| 6,259,078 | B1 * | 7/2001 | Araya ......................... 219/709 |
| 6,609,419 | B1 * | 8/2003 | Bankart et al. ............ 73/146.5 |

* cited by examiner

*Primary Examiner*—Carol S. W. Tsai
*Assistant Examiner*—Mohamed Charioui
(74) *Attorney, Agent, or Firm*—Oblon, Spivak, McClelland, Maier & Neustadt, P.C.

(57) ABSTRACT

An equipment status monitoring system having at least one multi-modal resonator included as a part of a semiconductor processing system and a power source coupled to the at least one multi-modal resonator. The power source is configured to produce a microwave excitation signal corresponding to at least one mode of the multi-modal resonator and emit the microwave excitation signal into the semiconductor processing chamber. The system includes a detector coupled to the at least one multi-modal resonator and configured to measure the excitation signal. The system includes a control system connected to the detector and configured to provide a comparison of at least one measured excitation signal with a normal excitation signal corresponding to a normal status.

37 Claims, 5 Drawing Sheets

FIG. 4

METHOD AND APPARATUS FOR MONITORING AND VERIFYING EQUIPMENT STATUS

CROSS-REFERENCE TO RELATED APPLICATIONS

The present application claims priority to U.S. application Ser. No. 60/352,504, filed on Jan. 31, 2002, the entire contents of which are herein incorporated by reference. The present application is related to co-pending International Application No. PCT/US00/19539, Publication No. WO 01/06402, published on Jan. 25, 2001; International Application No. PCT/US00/19536, Publication No. WO 01/06544, published on Jan. 25, 2001; International Application No. PCT/US00/19535, Publication No. WO 01/06268, published on Jan. 25, 2001; International Application No. PCT/US00/19540, Publication No. WO 01/37306, published on May 25, 2001; U.S. Application No. 60/330,518, entitled "Method and apparatus for wall film monitoring", filed on Oct. 24, 2001; U.S. Application No. 60/330,555, entitled "Method and apparatus for electron density measurement", filed on Oct. 24, 2001; co-pending U.S. Application No. 60/352,502, entitled "Method and apparatus for electron density measurement and verifying process status," filed on Jan. 31, 2002; co-pending application 60/352,546, entitled "Method and apparatus for determination and control of plasma state," filed on Jan. 31, 2002; and co-pending application 60/352,503, entitled "Apparatus and method for improving microwave coupling to a resonant cavity," filed on Jan. 31, 2002. The contents of these applications are incorporated herein by reference.

BACKGROUND OF THE INVENTION

1. Field of the Invention

The present invention generally relates to fabrication of integrated circuits in the semiconductor industry.

2. Discussion of the Background

The fabrication of integrated circuits (IC) in the semiconductor industry typically employs plasma to create and assist surface chemistry within a material processing chamber necessary to remove material from and deposit material to a substrate. In general, plasma is formed within the processing chamber under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

The semiconductor industry is constantly striving to produce smaller ICs and to increase the yield of viable ICs. Accordingly, the material processing equipment used to process the ICs have been required to meet increasingly more stringent performance requirements for etching and deposition processes (e.g., rate, selectivity, critical dimension).

SUMMARY OF THE INVENTION

The present invention relates to a method and apparatus for monitoring equipment status in a material processing chamber. The present invention advantageously provides a method and apparatus that enables device manufacturers to satisfy more stringent performance requirements for material processing equipment used in the semiconductor industry.

The present invention advantageously provides an equipment status monitoring system for a material processing system. The equipment status monitoring system of the present invention includes at least one multi-modal resonator. The invention further includes a power source coupled to the at least one multi-modal resonator, wherein the power source is configured to produce an excitation signal. Additionally, a detector is coupled to the at least one multi-modal resonator, wherein the detector is configured to measure the excitation signal. The invention also includes a control system connected to the detector and configured to provide a comparison of the measured excitation signal with a normal excitation signal corresponding to a normal status, wherein the comparison facilitates the determination of an equipment status.

The present invention further advantageously provides a method of monitoring a status of a material processing system. The material processing system includes a chamber, at least one multi-modal resonator positioned in relation to the chamber, a power source coupled to the at least one multi-modal resonator to produce an excitation signal, and a detector coupled to the at least one multi-modal resonator. The method of the present invention includes the steps of sweeping an output frequency of the power source in order to produce the excitation signal, recording the excitation signal using the detector, comparing the excitation signal to a normal excitation signal, and determining the status of the material processing system from the comparison of the measured excitation signal and the normal excitation signal.

The present invention further advantageously provides a method of altering the status of the material processing system by adjusting at least one of a chamber condition and a process recipe.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF THE PREFERRED EMBODIMENTS

The present invention generally relates to fabrication of integrated circuits in the semiconductor industry. The present invention advantageously provides a method and apparatus that enables semiconductor manufacturers to satisfy more stringent performance requirements for material processing equipment used in the semiconductor industry.

A method of improving the performance of material processing equipment is to monitor and control plasma electron density within the processing chamber during the manufacturing process. Ideally, the plasma electron density is maintained such that the processes being performed are both steadily acting in time and uniformly acting in space upon the entire surface of the substrate upon which work is being performed.

An exemplary device used to measure plasma electron density is a microwave system of suitably high frequency to exceed the electron plasma frequency. The device includes a pair of mirrors immersed in the plasma. Microwave power is coupled to a first microwave port on the first mirror and a detector is utilized to monitor the transmission of microwave power through the resonant cavity formed by the opposing mirrors. The detector is either coupled to a second port on the first mirror or a second port on the second mirror. For a Gaussian beam, cavity transmission occurs at discrete frequencies. The discrete frequencies correspond to an integer number of half wavelengths between the apex of each mirror, as expressed by the following equation:

$$v_{m,n,q} = v_{0,0,q} = \frac{c}{2\eta d}\left(q + \frac{1}{2}\right), \quad (1)$$

where $v_{0,0,q}$ is a resonant frequency of mode order q (assuming only longitudinal modes, i.e. m=n=0), c is the speed of light in a vacuum, η is the index of refraction for the medium bounded by the mirrors and d is the mirror spacing (apex-to-apex). For a vacuum, η=1, however, the presence of plasma or, more specifically, a population of free electrons leads to a reduction of the index of refraction or an observable increase (shift) of the cavity resonance frequencies $v_{0,0,q}$. For a given mode q, the shift in frequency can be related to the index of refraction n and, thereafter, the (integrated) electron density $<n_e>$, is expressed by the following equation:

$$\langle n_e \rangle \cong \frac{8\pi^2 \varepsilon_o}{e^2} v_o \Delta v, \quad (2)$$

for $v_0 \gg \omega_{pe}/2\pi$. For further details, the use of the above system to measure plasma electron density is described in International App. No. PCT/ITS00/19539 (based upon U.S. Ser. No. 60/144,880), International App. No. PCT/US00/19536 (based upon U.S. Ser. No. 60/144,883), International App. No. PCT/US00/19535 (based upon U.S. Ser. No. 60/144,878), and International App. No. PCT/US00/19540 (based upon U.S. Ser. No. 60/166,418), each of which is incorporated herein by reference in its entirety.

In addition to monitoring plasma electron density, it is also advantageous to monitor the equipment status of the material processing chamber. In particular, it is advantageous to monitor the status of the substrate to assure the presence of the substrate prior to processing, to assure the type of substrate prior to processing and to assure the location of the substrate prior to processing. Any deviation from the known substrate status can lead to loss of device yield and/or processing system shutdown. Moreover, it is advantageous to monitor the status of the chamber assembly to assure proper assembly of the chamber and to assure the proper chamber for the above process. Additionally, it is advantageous to monitor the status of chamber consumables to assure proper performance of the material processing system. Failure to detect an improper status of any of the above conditions can lead to catastrophic consequences for devices on the processed substrate. In order to combat this problem, an improper status of the material processing equipment can be detected, identified and corrected.

Figure 1A:
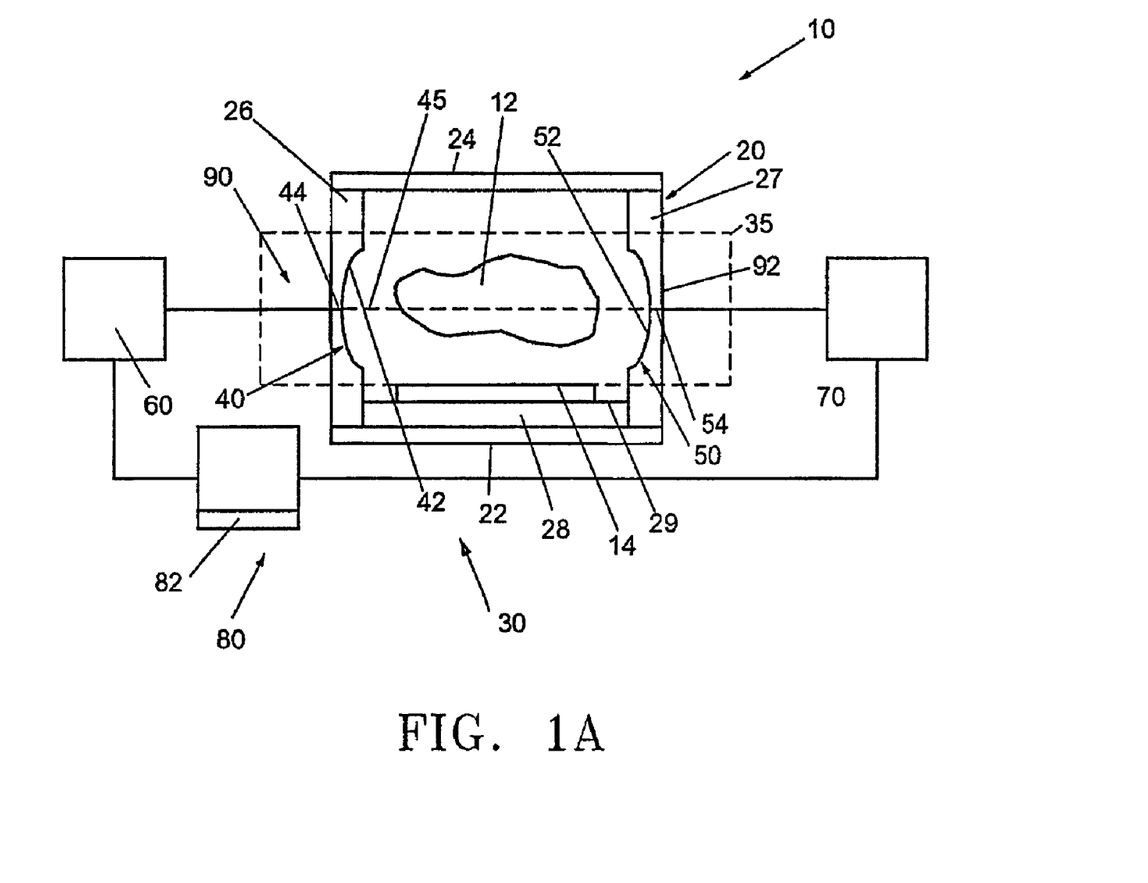
FIG. 1A is a schematic view of an equipment status monitoring system for a material processing chamber according to an embodiment of the present invention.

An embodiment of the plasma processing system 10 according to the present invention is depicted in FIG. 1A. The plasma processing system 10 includes a plasma chamber 20 and an equipment monitoring system 30 for use in the plasma chamber 20. The equipment monitoring system 30 generally includes at least one multi-modal resonator 35, power source 60, detector 70, and control system 80. Desirably, multi-modal resonator 35 comprises an open resonant cavity having at least one reflecting surface, and reflecting surfaces can have planar and/or non-planar geometries. In a preferred embodiment, the reflecting surfaces are provided within plasma chamber 20. Alternatively, at least one reflecting surface can be provided outside plasma chamber 20.

The plasma chamber 20 generally includes a base wall 22, an upper wall 24, and side walls including a first side wall 26 and a second side wall 27. The plasma chamber 20 also includes a substrate holder (or chuck assembly) 28 having a wafer plane 29, such as an upper surface of the substrate holder 28 upon which a substrate 14 is positioned in order to be processed within the plasma chamber 20.

In a preferred embodiment, multi-modal resonator 35 comprises first microwave mirror 40 coupled to power source 60, and second microwave mirror 50 coupled to detector 70. Multi-modal resonator extends along an axis generally parallel to a wafer plane of substrate holder 28 within plasma chamber 20.

In a preferred embodiment, the first microwave mirror 40 has a concave surface 42 and is provided within the plasma chamber 20. The second microwave mirror 50 has a concave surface 52 and is also provided within the plasma chamber 20. Alternately, the mirror surfaces can have flat and/or convex surfaces.

In the embodiment depicted in FIG. 1A, the first mirror 40 is integrated within side wall 26 of the plasma chamber 20 and the second mirror 50 is integrated within side wall 27 of the plasma chamber 20. The concave surface 52 of the second microwave mirror 50 is oriented opposite the concave surface 42 of the first microwave mirror 40. This geometry can be referred to as a confocal geometry when the spacing between the mirrors equals the radius of curvature of the mirrors. In an alternate embodiment, the mirrors are arranged in a semi-confocal configuration wherein a first mirror (comprising a concave surface of radius of curvature R) is located a distance d=R from a second mirror comprising a flat surface. In an alternate embodiment, the spacing d is adjusted to be different than the radius of curvature of both mirrors in the confocal arrangement or the radius of curvature of the first mirror in the semiconfocal arrangement. In an alternate embodiment, the radius of curvature for each mirror is arbitrary. The selection of the spacing and respective mirror radii of curvature is well known to those skilled in the art of designing resonant cavities.

The power source 60 is coupled to the first microwave mirror 40 and is configured to produce an excitation signal. Desirably, the excitation signals within multi-modal resonator 35 extend along an axis 45 generally parallel to a wafer plane 29 of a substrate holder 28. Control system 80 is coupled to power source 60 and is adapted to change at least one of: an output frequency, an output power, an output phase, and an operating state of power source 60. For example, control system 80 can cause power source 60 to change its operational state at various times before, during, and after a plasma has been established in plasma chamber 20.

Control system 80 is also coupled to detector 70. Desirably, detector 70 is configured to measure at least one transmitted excitation signal and provide transmitted signal measurement data, and detector 70 is configured to measure at least one reflected excitation signal and provide reflected signal measurement data. Alternately, detector 70 is configured to measure at least one transmitted excitation signal and provide transmitted signal measurement data, or detector 70 is configured to measure at least one reflected excitation signal and provide reflected signal measurement data.

In the embodiment depicted in FIG. 1A, the microwave mirrors 40 and 50 are immersed within the process plasma 12 such that the concave surfaces 42 and 52, respectively, oppose one another. Microwave power is input from the power source 60 to the first mirror 40 via a microwave aperture and the detector 70 is configured to monitor cavity transmission by being coupled to the opposite second mirror 50. The detector 70 can be coupled to either the mirror opposite to the mirror to which microwave power is input, as is the case in FIG. 1A, or the detector can be coupled to the same mirror to which microwave power is input (i.e. the first mirror 40 in FIG. 1A). As will be discussed in further detail below, microwave windows are inserted between the microwave input and the detector, and the respective mirror(s) to which the microwave input and the detector are connected, in order to preserve the integrity of the vacuum within the plasma processing chamber 20.

Figure 1B:
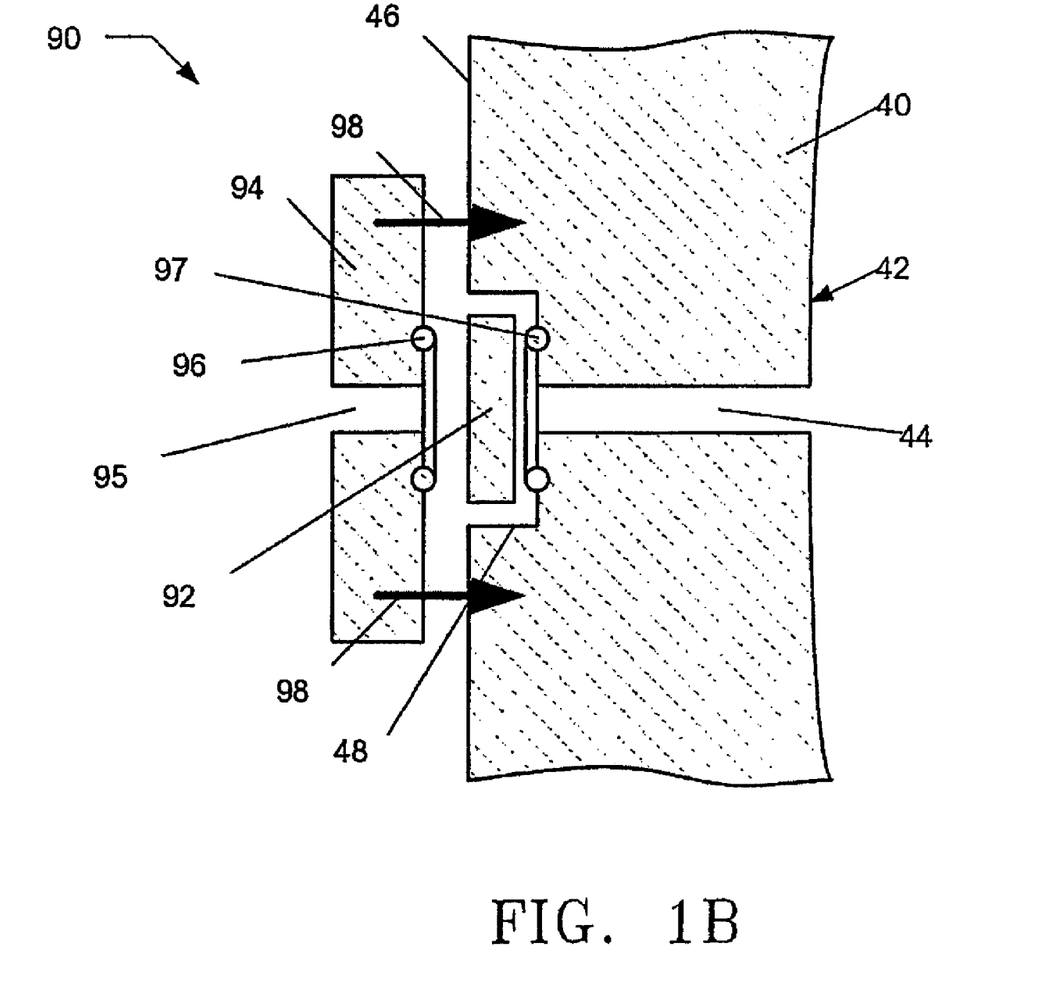
FIG. 1B is an enlarged, exploded, cross-sectional view of a microwave mirror having an aperture, a microwave window and associated mounting structure according to an embodiment of the present invention.

FIG. 1B depicts a detailed schematic of a microwave window assembly 90 for the first mirror 40, which is used to provide a coupling from the power source 60 through an aperture 44 in chamber wall 26 to the first mirror 40. A window assembly 90 having an identical structure is preferably provided for the second mirror 50, which is used to provide a coupling to the detector 70 through an aperture 54 in chamber wall 27 from the second mirror 50.

The microwave window assembly 90 depicted in FIG. 1B includes a microwave window 92 that is fastened between a window flange 94 and a rear surface 46 of the first mirror 40. In the embodiment depicted in FIG. 1B, the window 92 is provided within a recessed portion 48 on the rear surface 46 of the first mirror 40. The microwave window 92 is provided between a first O-ring 96 provided on the window flange 94 and a second O-ring 97 provided on the rear surface 46 of the first mirror 40. A plurality of fasteners 98 are provided to mechanically connect the window flange 94 to the first mirror 40 such that the microwave window 92 is securely mounted to the rear surface 46 of the first mirror 40. The window 92 is centered on a waveguide aperture 95 extending through the window flange 94 and the waveguide aperture 44 extending through the first mirror 40. The rectangular waveguide apertures 44 and 95 are sized for a specific microwave band of operation and are fabricated using Electrical Discharge Machining (EDM). In general, processing material will form on the vacuum or process side of the window 92, however, the processing material will form at a rate different than it will form on the mirror surface exposed to the plasma. The microwave window 92 is fabricated from a dielectric material such as alumina (sapphire), aluminum nitride, quartz, polytetrafluoroethylene (PTFE/Teflon), or Kapton. The window 92 is preferably fabricated from sapphire due to its compatibility with the oxide etch processes.

The mirrors 40 and 50 are preferably fabricated from aluminum. In alternative embodiments, the mirrors 40 and 50 are anodized with preferably a 10 to 50 micron thick anodization or coated with a material such as Yttria ($Y_2O_3$).

The microwave power source 60 is preferably an electronically tunable voltage controlled Gunn diode oscillator (VCO). When the varactor diode of the VCO is biased with a direct current voltage, the output frequency of the VCO can be varied over some spectral range. Therefore, the VCO specifications generally include center frequency, bandwidth and minimum output power. For example, at 35 GHz, a commercially available VCO is a WBV-28-20160RI Gunn diode oscillator offered by Millitech, LLC (20 Industrial Drive East, South Deerfield, Mass. 01373-0109). The specifications for this VCO include a center frequency of 35 GHz with plus or minus 1 GHz bandwidth and a minimum output power of 40 mW. The bias tuning range can generally extend from +25 V to −25 V, thereby adjusting this bias voltage leads to a change in the output frequency of the VCO. In alternative embodiments, operation at higher frequencies, such as 70 GHz and 105 GHZ, can be achieved using a frequency doubler (MLD-15-16F00) or tripler (MUT-10-16F00) with the above mentioned VCO. Using the above configuration, a center frequency of 70 GHz with plus or minus 2 GHz bandwidth and a minimum output power of 0.4 to 0.9 mW and a center frequency of 105 GHz with plus or minus 3 GHz bandwidth and a minimum output power of 0.4 to 0.7 mW can be achieved, respectively. In a preferred embodiment, a 94 GHz VCO (Model GV-10) is used and is commercially available from Farran Technology LTD (Ballincollig, Cork, Ireland). The Model GV-10 VCO has a center frequency of 94 GHz with plus or minus 750 MHz bandwidth, a minimum output power of 10 mW, and a varactor tuning range of −0 to −25 V.

The detector 70 is preferably a general purpose diode detector such as those commercially available from Millitech, LLC. For example, a DXP-15-RNFW0 and a DXP-10-RNFW0 are general purpose detectors in the V-band (50 to 75 GHz) and W-band (75 to 110 GHz), respectively. The detector detects an excitation signal representing (either linearly or non-linearly) the microwave power transmitted through the multi-model resonator.

The embodiment of the present invention depicted in FIG. 1A has a control system 80 that includes a lock-on circuit 82 connected to the power source 60 and the detector 70. Desirably, control system 80 comprises a computer connected to the lock-on circuit 82. The lock-on circuit 82 can be utilized to lock the frequency of the excitation signal output from the microwave power source 60 to a pre-selected cavity resonance. The lock-on circuit 82 superimposes a dither signal (e.g. 1 kHz, 10 mV amplitude square wave) on a direct current voltage substantially near the voltage and related output VCO frequency that corresponds with a pre-selected longitudinal frequency in the resonant cavity between the mirrors 40 and 50 of FIG. 1A (i.e. the output frequency of the VCO falls within the "envelope" of the selected cavity resonance). The signal detected by the detector 70 is provided to the lock-on circuit 82, where it represents a first derivative of the cavity transmission function (transmitted power versus frequency). The signal input to the lock-on circuit 82 from the detector 70 provides an error signal by which the direct current component of the VCO bias voltage is adjusted to drive the VCO output frequency to the frequency associated with the peak of a pre-selected longitudinal resonance as shown in FIG. 2.

In addition to operating in a cavity resonance lock-on mode as described above, the control system 80 further provides a function for sweeping the frequency spectrum of the multi-modal resonator. FIG. 2 presents an exemplary cavity transmission function (from a negative polarity detector) indicating several longitudinal resonances and the respective free spectral range (FSR). The cavity transmission as shown in FIG. 2 can be obtained by sweeping the VCO across a suitable frequency range sufficiently greater than the FSR. The excitation signal produced by the power source by sweeping the input varactor bias voltage can be, for instance, the cavity transmission or frequency spectrum of resonances.

Figure 2:
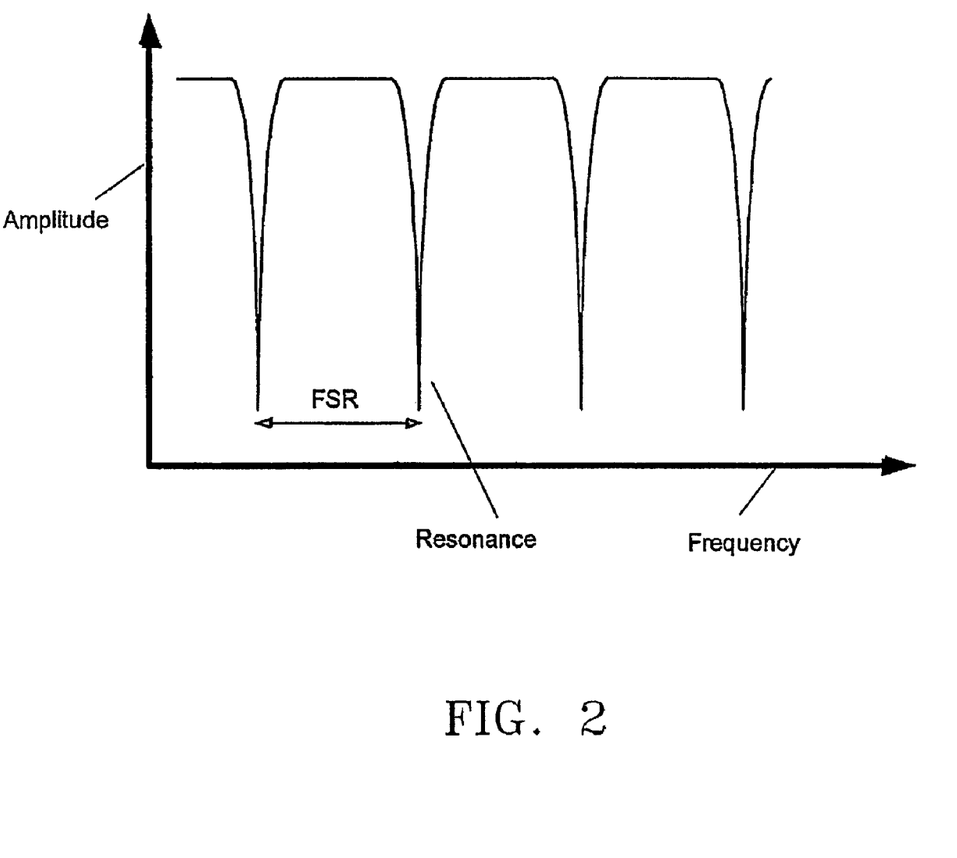
FIG. 2 is a graphical representation of an exemplary cavity transmission function showing several longitudinal resonances and a respective free spectral range.

As described above, the introduction of plasma within the chamber 20 causes a shift in frequency for each of the resonances shown in FIG. 2 (i.e. each of the resonances shift to the right in FIG. 2 when the electron density is increased or the index of refraction is decreased according to equation (1)). Therefore, once the output frequency of the VCO is locked to a selected cavity resonance, the direct current bias voltage with and without plasma can be recorded and the frequency shift of the selected resonance is determined from the voltage difference and the respective VCO calibration. For example, in wafer processing, the direct current bias voltage is recorded once a new wafer is received by the process tool for materials processing and prior to the ignition of plasma Hereinafter, this measurement will be referred to as the vacuum resonance voltage. Once the plasma is formed, the direct current bias voltage is obtained as a function of time for the given wafer and the time varying voltage difference or ultimately electron density (via equation (2)) is recorded.

Returning again to FIG. 2, the frequency spectrum of the cavity transmission is strongly dependent on several properties of the surrounding structures that are in substantial contact with the multi-modal resonator. These properties can include, but are not limited to, diagnostic properties such as, for example, the mirror alignment, size and design; chamber assembly properties such as, for example, the proximity of the chamber structure surrounding the multi-modal resonator and the materials comprising these structures; properties of the substrate such as, for example, the substrate material, thickness and size, and the substrate proximity to the multi-modal resonator; and properties of consumable elements such as size, material and proximity to the multi-modal resonator.

Due to the finite size of the multi-modal resonator, i.e. the diameter of the mirrors 40 and 50, and the diameter of the related microwave beam that extends between the mirrors, electromagnetic energy "spills" from the periphery of the mirrors and interacts with the surrounding structure. Some of this energy is dissipated in the structure and, hence, it is lost to heat; however, some of this energy is scattered from the surrounding structure and re-enters the multi-modal resonator. The scattering of electromagnetic energy by the surrounding structure is very sensitive to the structure geometry, the material type and the proximity of the surrounding structure to the multi-modal resonator. Therefore, it is expected that any change to an above identified property of the surrounding structure can lead to an observable change in the frequency spectrum of cavity resonances; hereinafter referred to as the resonance spectrum (FIG. 2). As described above, a resonance spectrum is one example of an excitation signal produced by sweeping the power source 60.

During processing, i.e. wafer-to-wafer and batch-to-batch, each of the above identified properties is subject to change except for the properties of the diagnostic, which are specifically chosen to be constant. A diagnostic calibration is typically required at each installation, to be discussed below. Several exemplary cases are now described, which will lead in to the description of a method of monitoring an equipment status according to the present invention. By comparing an excitation signal with a normal excitation signal a change in at least one of a substrate presence, substrate type, substrate location, chamber assembly status and a consumable status can be identified.

Improper assembly of the chamber can lead to a substantive change in the resonance spectrum. For example, if the chamber lid assembly is lifted to replace various components such as the gas injection plate, shield ring, focus ring, etc., an improper alignment, size or assembly of the re-installed component can be detected with a substantive change in the integrated resonance spectrum, for instance, zeroth or first moment (mean or variance), viz.

$$I_0 = \int_{f_1}^{f_2} V_d(f)\,df$$

or $$I_1 = \int_{f_1}^{f_2} V_d^2(f)\,df,$$

where $V_d$ is the detector voltage as a function of frequency f. Alternatively, a modal amplitude for a given resonance can be monitored, or net change in modal amplitudes can be monitored.

Improper substrate location can also lead to a substantive change in the resonance spectrum. Frequently, the substrate holder or chuck is translatable within the processing environment and, therefore, capable of vertical movement between a substrate load/unload position and a process position. The substrate load/unload position is generally unchanged; however, the process position can be variable depending upon the process recipe. The proximity of the chuck to the multi-modal resonator has a distinct effect on the resonance spectrum. Moreover, as the chuck position is changed, the ratio of modal amplitudes in a given, measured resonance spectrum can change depending on the chuck position relative to the multi-modal resonator. Alternatively, modal amplitude for a given resonance can be monitored, or an $n^{th}$ moment of the resonance spectrum can be monitored. For example, Table I presents the modal amplitude of three resonances (i.e. $A_1$, $A_2$ and $A_3$ of three longitudinal resonances) as a function of the electrode spacing h (or chuck location). For example, the spacing h can be the distance between substrate 14 and upper wall 24 in FIG. 1A.

TABLE I

Effect of modal amplitude for three longitudinal resonances on chuck location.

| h (mm) | $A_1$ (mV) | $A_2$ (mV) | $A_3$ (mV) |
|---|---|---|---|
| 150 | 25 | 25 | 15 |
| 50 | 28 | 29 | 19 |
| 45 | 17 | 16 | 13 |
| 40 | 4 | 10 | 9 |
| 35 | 1 | 2 | 2 |

Referring to Table, the modal amplitude for each resonance increases slightly for h=150 mm to h=50 mm and, then decays sharply from h=50 mm to h=35 mm (see FIG. 2 for an example of a longitudinal resonance).

The presence of the substrate as well as other properties such as, for example, the substrate thickness, can be detected due to differences in the observed resonance spectrum with and without a substrate. In general, the presence of a substrate and, more particularly, a silicon substrate leads to a reduction of the modal amplitudes as well as the modal quality factors. The reduction in amplitude can be as great as 10 to 20% (depending upon the substrate material, size and thickness). Therefore, the presence of a substrate can-be determined by monitoring at least one modal amplitude. Alternatively, the net change in modal amplitudes of an observed resonance spectrum can be monitored.

Figure 3:
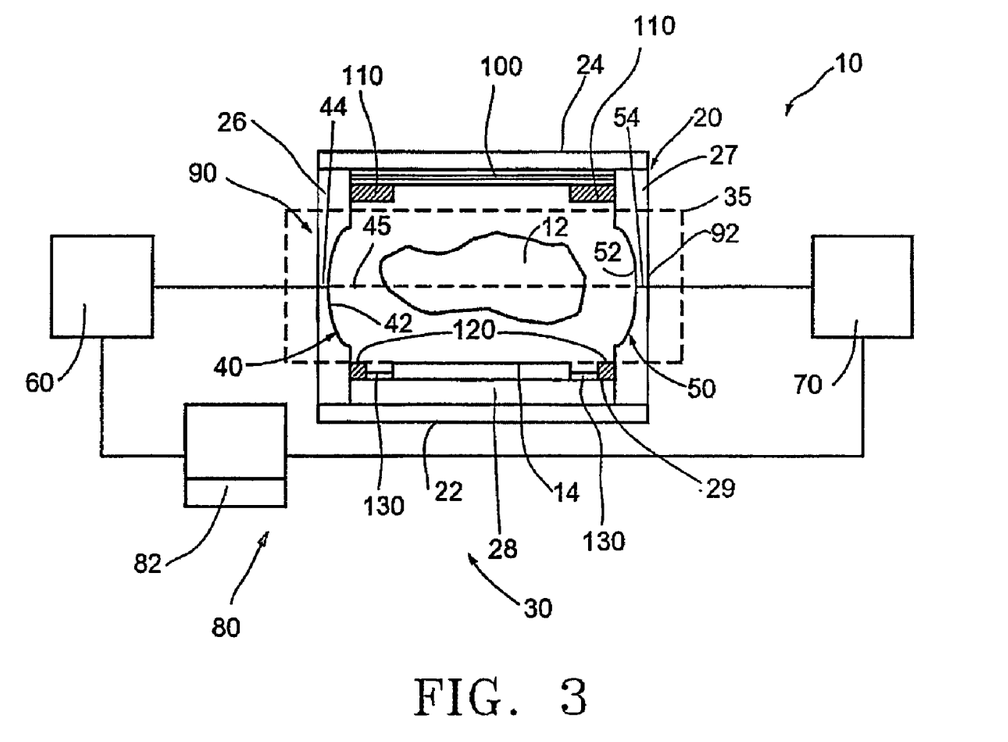
FIG. 3 is a schematic view of an equipment status monitoring system for a material processing chamber according to an embodiment of the present invention.

Substantial erosion of consumable elements can be detected during their lifetime due to their net effect on the resonance spectrum and, in time, produce a variation of the consumable status. For example, in oxide etch applications, the material processing chamber is generally clad with several consumable elements, such as a silicon gas injection electrode 100, quartz shield rings 110,120 and a silicon focus ring 130 (see FIG. 3). During substrate processing, these consumable elements erode and, in time, the resonance spectrum can substantially change indicating a point to replace the consumable elements. For example, erosion of the silicon comprising consumable elements can lead to less loss and, therefore, an increase in modal amplitudes or an $n^{th}$ moment of the resonance spectrum, or an increase in a given modal quality factor. Conversely, erosion of the quartz comprising consumable elements can lead to substantive changes in a given, observed resonance spectrum, such as, for example, changes in the ratio of one modal amplitude to another.

Following the trends above, a variation in equipment status as governed by a substrate presence, substrate type, substrate location, chamber assembly status and a consumable status can be detected by comparing a measured excitation signal with a normal excitation signal. In one embodiment, a difference can be detected by comparing at least one modal amplitude. In an alternate embodiment, a difference can be detected by at least one of: a change in a modal amplitude; a net change in the modal amplitudes of a resonance spectrum; a change (including shift) in at least one resonance location (frequency/frequencies) (including a shift in all measured resonance locations); a change in relative spacings between modes; a net change in the each of the resonance frequencies; a change in the ratio of one modal amplitude to a second modal amplitude; a change in a (modal) signal quality factor; a change in an integrated property of the excitation signal such as, for example, a zeroth moment, a first moment, a second moment and a third moment; and a change in a differentiated property of the excitation signal such as, for example a slope (first derivative), second derivative, and third derivative. One such change is the change in resonance location (frequency) (e.g., due to buildup of a film or films on the resonator mirror(s) or a temperature effect on the stability of the VCO).

As mentioned above, the diagnostic generally comprises a specific design and, therefore, once the diagnostic is installed within a processing system, the properties of the diagnostic, i.e. size, alignment, etc., are not susceptible to change. At each installation of the diagnostic, either re-installation, diagnostic upgrade, diagnostic repair, etc., the material processing system, to which it is installed, must be characterized. Therein, the resonance spectrum (or excitation signal) is recorded for each process to be performed in the material processing system, and a series of normal excitation signals are determined. For example, a substrate of given type, material and size, is loaded. Thereafter, the excitation signal is recorded for the system when the substrate is located at the load/unload position and the process position (as specified by the process recipe). These two normal excitation signals indicate a normal status for substrate loading/unloading and substrate processing, respectively. Moreover, the substrate can be removed and the above measurements repeated. Following this procedure, a normal substrate presence, a normal substrate type, a normal substrate location, a normal chamber assembly status and a normal consumable status can be determined and recorded within control system 80. For example, Table I will be used below to represent the normal substrate location for recipes at different electrode spacings. Once the normal excitation signals corresponding to the normal excitation statuses are determined, a method of monitoring the equipment status can be described.

Figure 4:
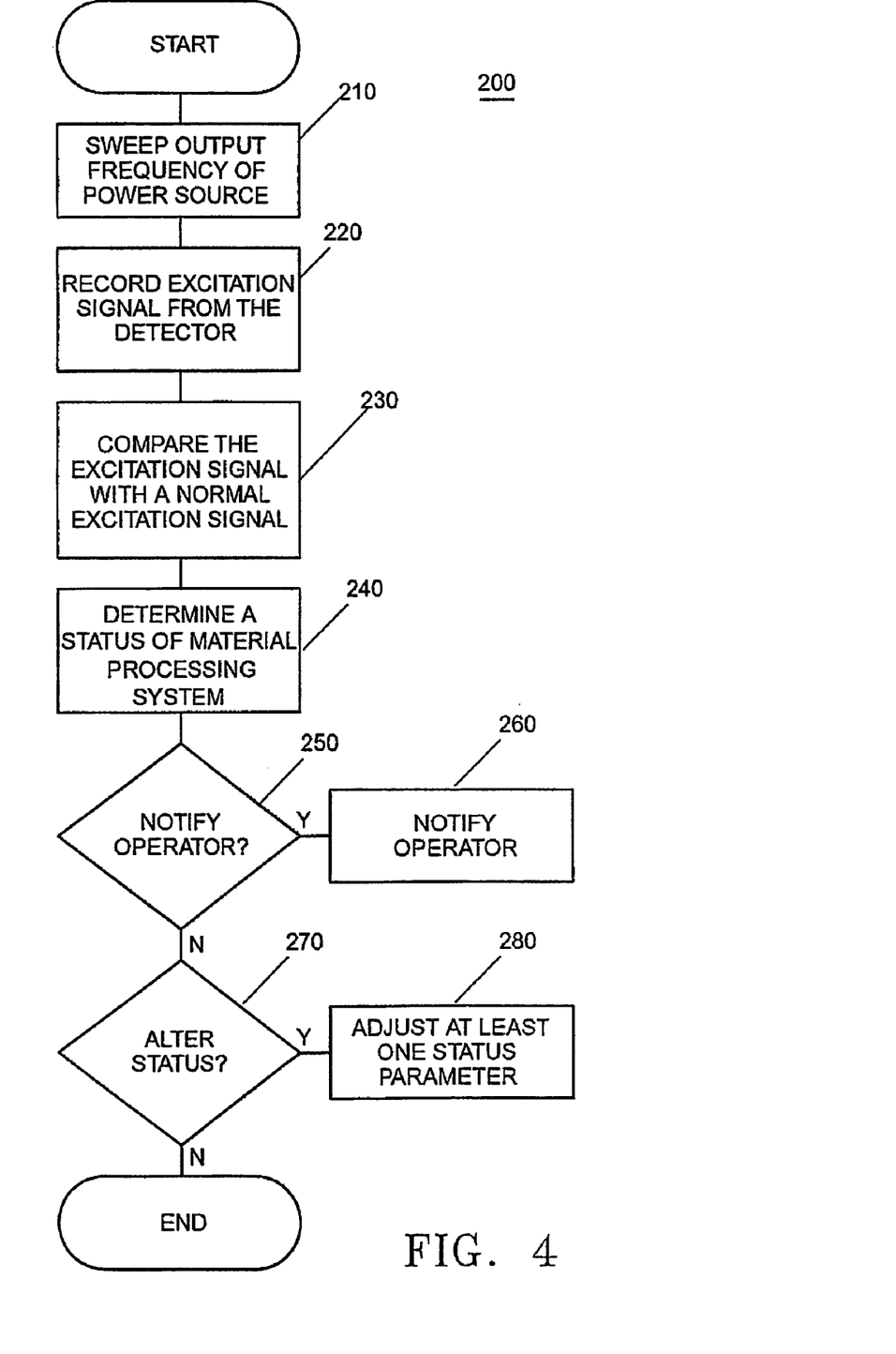
FIG. 4 is a flow diagram of a method of monitoring equipment status in a material processing chamber according to an embodiment of the present invention.

FIG. 4 is a flowchart 200 of a method of monitoring the equipment status by measuring an excitation signal. The process begins with step 210, wherein the varactor bias voltage for the power source 60 is swept according to either a periodic (i.e. saw-tooth) or aperiodic function in time. In step 220, the excitation signal detected by detector 70 is recorded by control system 80. For example, the detector may record that $A_1$, $A_2$ and $A_3$ have values of 17, 15 and 14, respectively when the process recipe calls for a 40 mm electrode spacing. In step 230, the measured excitation signal is compared to a normal excitation signal and, depending on the nature of the differences as described above (if any), the equipment status is determined relative to the normal status in step 240. Thus, in the continuing example, the method would determine that the values for $A_1$-$A_3$ are more similar to a 45 mm spacing than a 40 mm spacing, representing a misplacement of the chuck. Using the equipment status, step 250 proceeds to perform a decision on whether to notify the system operator in step 260. In the continuing example, the operator is notified of the misplacement of the chuck and given the opportunity to tell the system to correct the error. Step 270 proceeds to perform a decision on whether to alter the equipment status in step 280. In step 280, at least one of a substrate presence, a substrate type, a substrate location, a chamber assembly status, and a consumable status is adjusted. For example, if requested by the operator, the chuck would be moved from the incorrect 45 mm spacing to the recipe-specific 40 mm spacing.

A substrate presence can be altered, for example, by loading a substrate; a substrate type can be altered, for example, by replacing the current substrate with a substrate comprising a different material or of a different size; a substrate location can be altered, for example, by verifying the current chuck position and translating the chuck to a different position; a chamber assembly status can be altered, for example, by verifying proper chamber assembly and performing necessary corrective action; and a consumable status can be altered, for example, by replacing at least one consumable element.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

The invention claimed is:

1. An equipment status monitoring system, said equipment status monitoring system comprising:
    at least one multi-modal resonator included as a part of a semiconductor processing system;
    a power source coupled to said at least one multi-modal resonator, said power source being configured to produce a microwave excitation signal corresponding to at least one mode of said multi-modal resonator and emit the microwave excitation signal into the semiconductor processing chamber;
    a detector coupled to said at least one multi-modal resonator, said detector being configured to measure said microwave excitation signal; and
    a control system connected to said detector and configured to provide a comparison of at least one measured excitation signal with a normal excitation signal corresponding to a normal status, wherein said comparison determines an equipment status.

2. The equipment status monitoring system according to claim 1, wherein said comparison of at least one measured excitation signal with a normal excitation signal comprises a comparison of an integrated signal.

3. The equipment status monitoring system according to claim 2, wherein said comparison of said integrated signal comprises a comparison of at least one of a zeroth moment, a first moment, a second moment and a third moment of said at least one measured excitation signal and said normal excitation signal.

4. The equipment status monitoring system according to claim 3, wherein said comparison of a differentiated signal comprises a comparison of at least one slope in said at least one measured excitation signal with at least one slope in said normal excitation signal.

5. The equipment status monitoring system according to claim 1, wherein said comparison of at least one measured excitation signal with a normal excitation signal comprises a comparison of signal amplitude.

6. The equipment status monitoring system according to claim 5, wherein said comparison of signal amplitude comprises comparing at least one modal amplitude in said at least one measured excitation signal to at least one modal amplitude in said normal excitation signal.

7. The equipment status monitoring system according to claim 5, wherein said comparison of signal amplitude comprises comparing at least one ratio of a first modal amplitude in said at least one measured excitation signal and a second modal amplitude in said at least one measured excitation signal to at least one ratio of a first modal amplitude in said normal excitation signal and a second modal amplitude in said normal excitation signal.

8. The equipment status monitoring system according to claim 1, wherein said comparison of at least one measured excitation signal with a normal excitation signal comprises a comparison of signal quality factor.

9. The equipment status monitoring system according to claim 8, wherein said signal quality factor corresponds to a quality factor of at least one resonance mode.

10. The equipment status monitoring system according to claim 1, wherein the resonator comprises two opposing mirrors disposed as part of the semiconductor processing chamber.

11. The equipment status monitoring system according to claim 10, wherein one of the mirrors comprises a waveguide aperture configured to transmit microwave radiation into the semiconductor processing chamber.

12. The equipment status monitoring system according to claim 1, wherein said equipment status includes at least one of substrate presence, substrate type, substrate location, chamber assembly status, and consumable status.

13. The equipment status monitoring system according to claim 1, wherein said normal excitation signal comprises an excitation signal associated with at least one of normal substrate presence, normal substrate type, normal substrate location, normal chamber assembly status, and normal consumable status.

14. The equipment status monitoring system according to claim 1, wherein said excitation signal is one of a voltage, current and power proportional to a microwave power transmitted through said multi-modal resonator.

15. The equipment status monitoring system according to claim 1, wherein said excitation signal is a spectrum comprising at least one modal frequency.

16. The equipment status monitoring system according to claim 1, wherein said comparison of at least one measured excitation signal with a normal excitation signal comprises a comparison of at least one signal frequency.

17. The equipment status monitoring system according to claim 1, wherein said comparison of at least one measured excitation signal with a normal excitation signal comprises a comparison of a differentiated signal.

18. A method of monitoring a status of a material processing system, said material processing system including a chamber, at least one multi-modal resonator positioned in relation to said chamber, a power source coupled to said multi-modal resonator, and a detector coupled to said multi-modal resonator, said method comprising:
    sweeping an output frequency of said power source to produce a microwave excitation signal;
    emitting the microwave excitation signal into a semiconductor processing chamber;
    recording said excitation signal from said multi-mode resonator;
    comparing said excitation signal with a normal excitation signal, wherein said normal excitation signal corresponds to a normal status of said material processing system;
    determining said status of said material processing system from said comparing; and
    providing said status to at least one of an operator and a control system for the material processing system.

19. The method according to claim 18, wherein said comparing said excitation signal with said normal excitation signal comprises comparing a signal amplitude.

20. The method according to claim 19, wherein said comparing a signal amplitude comprises comparing at least one modal amplitude in said excitation signal to at least one modal amplitude in said normal excitation signal.

21. The method according to claim 19, wherein said comparing a signal amplitude comprises comparing at least one ratio of a first modal amplitude in said excitation signal and a second modal amplitude in said excitation signal to at least one ratio of a first modal amplitude in said normal excitation signal and a second modal amplitude in said normal excitation signal.

22. The method according to claim 18, wherein said comparing said excitation signal with said normal excitation signal comprises a comparison of signal quality factor.

23. The method according to claim 22, wherein said signal quality factor corresponds to a quality factor of at least one resonance mode.

24. The method according to claim 18, wherein said comparing said excitation signal with said normal excitation signal comprises a comparison of an integrated signal.

25. The method according to claim 24, wherein said comparison of said integrated signal comprises a comparison of at least one of a zeroth moment, a first moment, a second moment and a third moment of said excitation signal and said normal excitation signal.

26. The method according to claim 18, wherein said comparing said excitation signal with said normal excitation signal comprises a comparison of a differentiated signal.

27. The method according to claim 26, wherein said comparison of a differentiated signal comprises a comparison of at least one slope in said excitation signal with at least one slope in said normal excitation signal.

28. The method according to claim 18, wherein emitting comprises emitting the excitation signal into a semiconductor processing chamber having two opposing mirrors disposed as part of the semiconductor processing chamber.

29. The method according to claim 28, wherein emitting comprises transmitting microwave radiation through a waveguide aperture in one of the mirrors into the semiconductor processing chamber.

30. The method according to claim 18, wherein said status of said material processing system includes at least one of substrate presence, substrate type, substrate location, chamber assembly status, and consumable status.

31. The method according to claim 18, wherein said normal status of said material processing system corresponds to at least one of normal substrate presence, normal substrate type, normal substrate location, normal chamber assembly status, and normal consumable status.

32. The method according to claim 18, wherein the method further includes altering said status of said material processing system by adjusting at least one of said substrate presence, said substrate type, said substrate location, said chamber assembly status, and said consumable status.

33. The method according to claim 18, wherein said sweeping said output frequency of said power source comprises varying an input bias voltage of said power source according to at least one of a periodic and an aperiodic function.

34. The method according to claim 18, wherein said microwave signal is a voltage proportional to a power transmitted through said multi-modal resonator.

35. The method according to claim 18, wherein said comparing said excitation signal with said normal excitation signal comprises a comparison of signal frequency.

36. An equipment status monitoring system, said equipment status monitoring system comprising:

at least one multi-modal resonator;

a power source coupled to said at least one multi-modal resonator, said power source being configured to produce a microwave excitation signal corresponding to at least one mode of said multi-modal resonator;

a detector coupled to said at least one multi-modal resonator, said detector being configured to measure said microwave excitation signal; and a control system connected to said detector and configured to provide a comparison of at least one measured excitation signal with a normal excitation signal corresponding to a normal status, wherein said comparison determines an equipment status wherein said comparison of at least one measured excitation signal with a normal excitation signal comprises a comparison of at least one of a signal frequency, a signal quality factor, a signal quality factor of at least one resonance mode, and an integrated signal.

37. A method of monitoring a status of a material processing system, said material processing system including a chamber, at least one multi-modal resonator positioned in relation to said chamber, a power source coupled to said multi-modal resonator, and a detector coupled to said multi-modal resonator, said method comprising:

sweeping an output frequency of said power source to produce a microwave excitation signal;

recording said microwave excitation signal from said multi-mode resonator;

comparing said excitation signal with a normal excitation signal, wherein said normal excitation signal corresponds to a normal status of said material processing system;

determining said status of said material processing system from said comparing; and providing said status to at least one of an operator and a control system for the material processing system, wherein said comparing said excitation signal with said normal excitation signal comprises a comparison of at least one of a signal frequency, a signal quality factor, a signal quality factor of at least one resonance mode, and an integrated signal.

* * * * *